METHOD OF MAKING A SEMICONDUCTOR DEVICE

Filed Oct. 16, 1967 3 Sheets-Sheet 1

INVENTORS
MINORU ONO
YOSHIO TANAKA
SEIICHI IWAMATSU

BY Craig & Antonelli
ATTORNEYS

INVENTORS
MINORU ONO
YOSHIO TANAKA
SEIICHI IWAMATSU

BY Craig & Antonelli
ATTORNEYS

INVENTORS
MINORU ONO
YOSHIO TANAKA
SEIICHI IWAMATSU

BY Craig & Antonelli
ATTORNEYS

United States Patent Office 3,589,939

Patented June 29, 1971

3,589,939

METHOD OF MAKING A SEMICONDUCTOR DEVICE

Minoru Ono, Kodaira-shi, Yoshio Tanaka, Hachioji-shi, and Seiichi Iwamatsu, Kodaira-shi, Japan, assignors to Hitachi, Ltd., Tokyo, Japan Filed Oct. 16, 1967, Ser. No. 675,702

Int. Cl. B44d *1/18*

U.S. Cl. 117—217 25 Claims

ABSTRACT OF THE DISCLOSURE

A method of making a stabilized semiconductor device, wherein a semiconductor substrate covered with an insulating film such as a silicon oxide film is heated to a temperature not breaking the components thereof and an electrode metal e.g. aluminum, endowed with a predetermined electric potential with respect to the substrate, is evaporated to deposit an electrode metal layer on the surface of the film.

This invention relates to a method of making a semiconductor device having a protective coating formed on a semiconductor substrate, this method including deposition of a metal layer on said protective coating by evaporation.

According to a method of making a semiconductor device by planar techniques, an active impurity for determining a conductivity type is selectively introduced into a semiconductor substrate by using an $SiO_2$ film formed on the substrate surface as a mask, and then the $SiO_2$ film on that part of the substrate to which an electrode is to be connected is etched away to set an electrode. In such a work of electrode setting, the electrode metal like aluminum is evaporated on the substrate surface exposed by the partial elimination of the $SiO_2$ film as well as on the $SiO_2$ film and then the metal layer on the $SiO_2$ film is selectively etched away in a predetermined pattern by photoetching. Then, a connector wire like an Au wire is connected to said metal layer remaining on the $SiO_2$ film by thermocompression bonding.

Generally, silicon oxide films as described above, have a strong tendency to induce a donor type level on a semiconductor substrate surface contacting the film. Accordingly, the conductivity or the conductivity type of the semiconductor surface part is different from that of the semiconductor substrate before forming the film. For example, when the semiconductor substrate is of a weak P-type, negative charges are accumulated at the surface part due to the influence of the silicon oxide film formed on the surface and the conductivity type of the surface part is inverted to N-type. Souch an inverted layer is sometimes called a channel layer.

It has been reported that such a property of the silicon oxide film is further enhanced by the evaporation of an electrode material on the film.

The generation of the channel layer imposes undesirable influences like the increase of the leakage current on the electrical characteristics of the semiconductor device and further it gives rise to the variation of the electrical characteristics with time. Therefore, some means to suppress or stabilize this tendency of the oxide film have been desired.

Accordingly, an object of the present invention is to provide a method of making a stabilized semiconductor device.

Another object of the present invention is to provide a method of making a semiconductor device comprising a semiconductor substrate covered with an isulating film, wherein the operation of said device can be stabilized by suitably controlling the variation of the interface characteristics of the substrate surface contacting the film like the phenomenon of the conductivity type inversed layer at the semiconductor substrate surface induced by the film which is known as the channel phenomenon.

Still another object of the present invention is to provide a method of making a semiconductor device whose characteristics are uniform and reproducible.

In the following detailed description, this invention will be described with reference to an MOS type capacitor which is a semiconductor device having a Metal-Oxide-Semiconductor structure which is the simplest structure and wherein the measurement of the surface potential is simple and some conventional techniques are also described to easily understand this invention. However, it should be stressed that the present invention is evidently distinguished from the conventional techniques and that the invention is by no means restricted to the manufacture of an MOS type capacitor.

The essential point of this invention lies in the fact that a semiconductor substrate on which surface an insulating film is formed is heated to a temperature not breaking the components thereof and the metallic particles to be evaporated are maintained to have a predetermined electric potential with respect to the substrate when depositing the metallic particles on the film by vacuum evaporation. It is to be noted that the meaning of the predetermined electric potential as defined in this specification includes zero potential or equipotential.

Other objects, features and advantages of the invention will become more apparent from the following detailed description of the invention when taken in conjunction with the accompanying drawings.

FIG. 1 shows an electrical circuit diagram of an evaporation device according to an embodiment of this invention;

FIG. 2*a* is a sectional view of an MOS type capacitor presented for the explanation of this invention;

FIG. 2*b* is an electrical equivalent circuit diagram of the capacitor shown in FIG. 2*a*;

DESCRIPTION OF THE PREFERRED EMBODIMENTS

Figures 1, 2A, 2B:
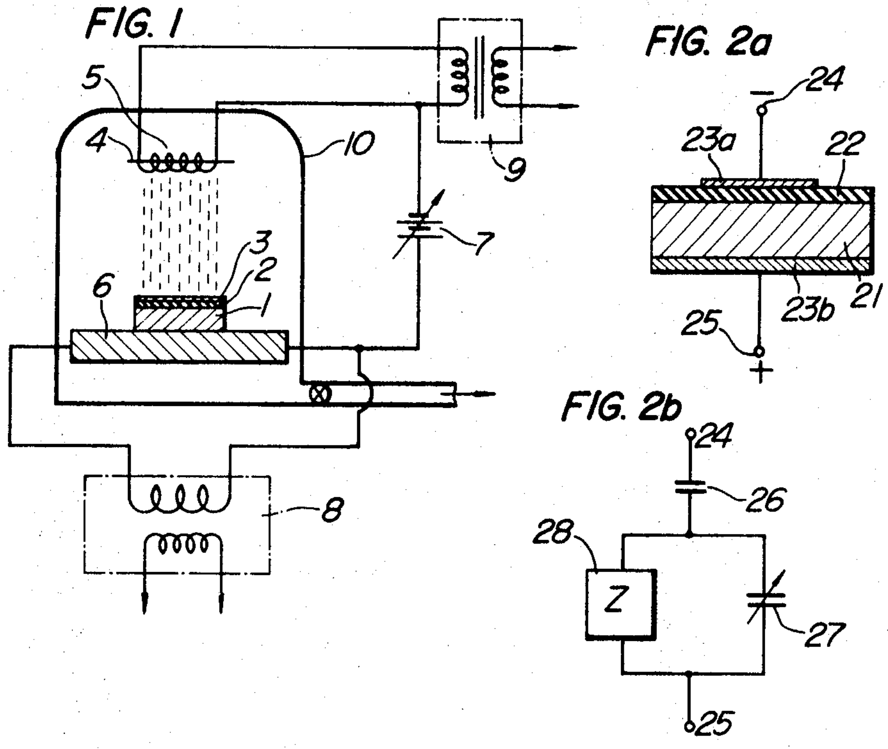

It is known that the electrostatic capacity of an MOS type capacitor as shown in FIG. 2*a* which comprises a P-type Si semiconductor substrate 21, an $SiO_2$ film 22, electrodes 23*a*, 23*b* and terminals 24, 25 depends on the applied potential. Namely, as shown in FIG. 2*b* which illustrates the electrical equivalent circuit of the device shown in FIG. 2*a*, the part between the terminals 24 and 25 substantially includes an electrostatic capacity 26 due to the $SiO_2$ film and a parallel circuit of a certain impedance 28 and a variable capacitance 27 which is connected in series with the capacity 26. The variable capacitance 27 depends on the potential applied between the terminals 24 and 25 and is formed because the carrier (hole or electron) concentration in the surface layer of the substrate covered with the $SiO_2$ film changes with the applied potential. Such MOS type capacitors are provided as follows. A P-type silicon wafer having a specific resistance of about 1.3Ω-cm. is prepared at first and this wafer is placed in a hot furnace of about 1200°

C. in which wet air is provided. By maintaining it for several tens of minutes, an $SiO_2$ film of 2000 A. is thermally grown on the surface of the wafer. In this case, an N-type layer called an inversion layer is formed on the silicon surface just under the $SiO_2$ film. After the wafer is taken out of the furnace, an electrode metal layer as of Al is deposited all over a principal surface of the $SiO_2$ film. At this time, an evaporation device shown in FIG. 1 is used. In this device, the Si substrate 1 (which comprises the $SiO_2$ film 2) obtained in the manner described above, i.e. a sample is mounted on a carbon heater 6 connected to a first transformer 8 and evaporation material 4 like Al is placed over the sample with an evaporation source heater 5 connected to a second transformer 9. The components except the transformers are contained in a bell-jar or an evacuated enclosure 10 as depicted in the figure. As means to maintain the evaporation material at a predetermined potential with respect to the substrate, a variable D.C. power supply 7 is connected between the semiconductor substrate 1 and the evaporation source heater 5 or the evaporation material 4 (e.g. Al). If an MOS type capacitor is to be obtained with this device, the power supply 7 is set at 100 v. with respect to the sample obtained previously (the resistance of the Si substrate is 1.3Ω-cm. and thickness of the $SiO_2$ film is 2000 A.) and the electrode metal layer 3 is deposited all over the surface of the $SiO_2$ film 2 from the evaporation source comprising 4 and 5, placed 5 cm. above the substrate while heating the substrate 1 at 300° C. Then, Al layer is etched away leaving disked-shaped parts, each having a diameter of about 0.6 mm. to form a plurality of electrodes. After this, the $SiO_2$ film on the opposite surface is removed, and the wafer is divided into a plurality of parts so as to obtain MOS elements. Then, the thus obtained element is connected to a support member (electrode) **23*b*. The practical example of this support member include conventional sealing means like a combination comprising a cap and a stem. The electrostatic capacitance and the voltage characteristic of the MOS type capacitor obtained in this way are shown by curve 32** in FIG. 3.

Figure 3:
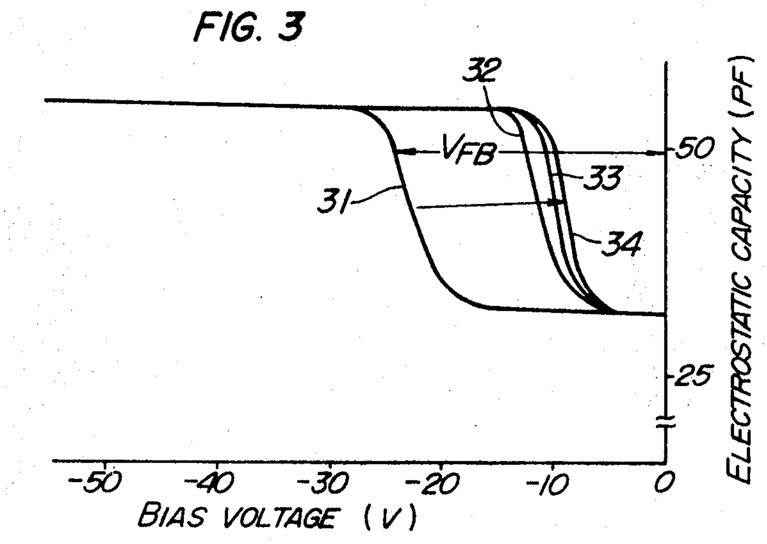
FIG. 3 is a diagram showing the voltage dependence of the elestrostatic capacity of the MOS type capacitor presented for the explanation of this invention.
Figure 4:
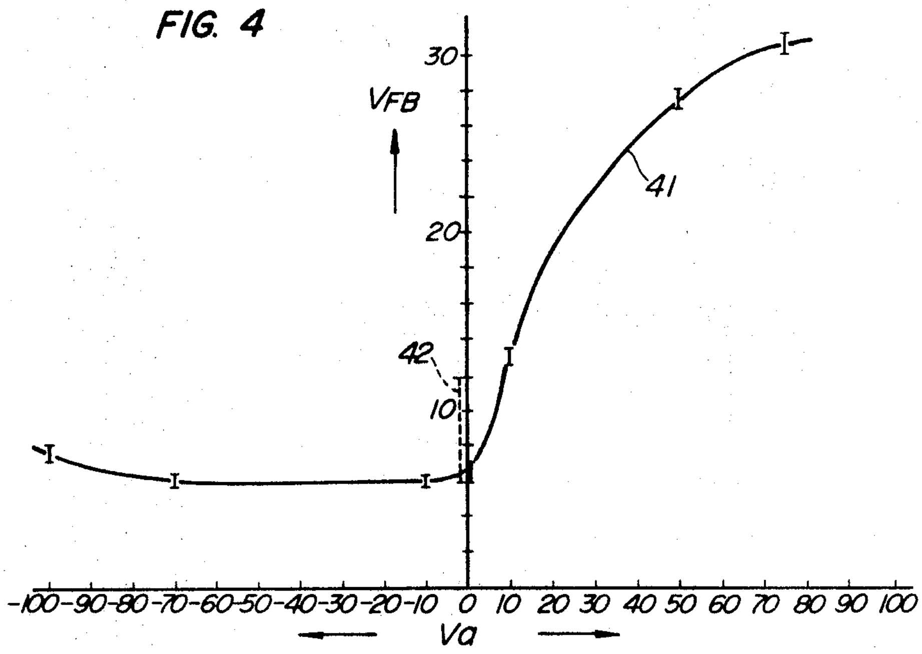
FIG. 4 is an electrical characteristic diagram for the explanation of another embodiment of this invention.

Now, another method of making MOS type capacitors embodying the present invention will be described. A plurality of P-type Si substrates each having a specific resistance of 20Ω-cm. are prepared and subjected to heat treatment with oxygen atmosphere of about 1200° C. to form an $SiO_2$ film of 2000 A.–3000 A. thickness on each substrate surface. Aluminum is evaporated on the $SiO_2$ film with the evaporation device described hereinbefore. In order to study the effect of the voltage of the D.C. power supply 7 on the electrical properties of the MOS type capacitors, the voltage of the power supply 7 was varied during the evaporation of the aluminum. In this case, five sample wafers were formed corresponding to one potential value of the power supply 7 and a plurality of MOS type elements each having an aluminum electrode of 0.6 mm. in diameter were obtained from each of the wafers according to the method embodying the invention. One element was arbitarily selected from the MOS type elements obtained from each wafer and, in all, five elements were selected. With these elements, the relation between the voltage $V_{FB}$ and the voltage applied at the time of evaporation, $Va$, and the dispersion of $V_{FB}$ at the predetermined voltage were measured and the result is shown in FIG. 4. The voltage $V_{FB}$ is considered to correspond to a potential to be applied to the surface of the $SiO_2$ film to flatten the energy band bent by the $SiO_2$ film at the substrate surface and more concretely, it corresponds to a voltage of rapid change of capacity in an ideal oxide film (in this case, the bending of the energy band at the semiconductor surface does not occur) in the capacity-voltage characteristic as shown in FIG. 3, i.e. the potential difference between OV and the voltage of rapid change of capacity in a practical MOS type element. Curve 41 is obtained by connecting the mean value of $V_{FB}$ of the five elements at various values of the applied potential $Va$ (the polarity shown in FIG. 1 is chosen to be positive) and the I-type symbol indicates the width of the dispersion with these five elements. The reference numeral 42 shows the width of the dispersion among the five elements when the present invention is not applied, that is, when the means 7 to maintain the evaporation metal at a specified potential with respect to the substrate 1 is not provided. It is understood from FIG. 4 that the effect of the invention is remarkable, namely that the dispersion is suppressed and elements having uniform characteristic can be obtained. It is to be noted in FIG. 4 that the effect is remarkable even when the potenial of the substrate is set at zero with respect to the evaporation metal or the substrate and the metal are short-circuited.

By the examination of the characteristics of the MOS type elements obtained according to the two embodiments, it is found that the variation of the characteristics with time is small and the characteristics are stable and uniform.

In order to clarify such phenomena, some auxiliary experiments were performed. In FIG. 3, curve 31 shows the voltage-capacity characteristic of an MOS type capacitor subjected to evaporation treatment without use of the D.C. power supply 7. This curve assumes a value quite sensitive to the condition of usage, unstable and quite dispersive. Therefore, the operation to obtain curve 34 in FIG. 3 was undertaken. Under this operation, the MOS type capacitor having a characteristic shown by curve 31 is subjected to heat treatment wherein the capacitor is maintained at 250° C. for about 40 minutes while applying a D.C. voltage of 6 v. with the polarity shown in FIG. 2*a* and then cooled to move the capacity-voltage characteristic to curve 34 of FIG. 3 as indicated by the arrow. Such a treatment has been proposed in U.S. patent application S.N. 372,350. The aim of this treatment is to minimize the carrier (electron) concentration in the N-type inversion layer induced by the $SiO_2$ layer 22 to a value intrinsic to the substrate semiconductor and thereby the capacity-voltage characteristic (curve 34 in FIG. 3) becomes quite stable and the characteristics of the MOS type capacitors which are not uniform due to the influence of the $SiO_2$ layer or the like becomes uniform. This effect is considered to stem from the fact that the ions or the charges in the $SiO_2$ film are moved to the surface of the $SiO_2$ layer and fixed therein by the effect of heat and the electric field and thereby the electron concentration in the Si surface layer is lowered and stabilized. Further, the voltage-capacity characteristic of MOS type capacitors subjected to evaporation treatment without application of heat and an electric field was also measured. The result is shown by curve 33 in FIG. 3. In this case, however, the aluminum layer **22*a* is likely to peel off the $SiO_2$ film 22**.

Accordingly, the phenomena resulting from application of this invention are interpreted as follows, though the interpretation is not decisive. Since the aluminum particles, all having the same electrical potential are deposited on the $SiO_2$ film, positive ions in the $SiO_2$ film which have received energy by heating are rearranged into the most stable state and the electric field induced by the ions changes the electron concentration in the Si surface layer almost uniformly. In other words, a kind of the treatment based upon heat and an electric field (the method to produce curve 34) occurs substantially. In fact, as seen from FIG. 1, when the power supply 7 is absent, it is considered that the particles having time-dependent potentials due to the floating-potential are deposited on the $SiO_2$ film.

As to the temperature of heating, in order to improve the Si-$SiO_2$ interface characteristics it is only required that the temperature is more than about 75° C. and less than the value at which the components of the elements may be broken down. However, when the adherence of the electrode metal to the $SiO_2$ film is taken into consideration, a temperature of about 200°–600° C. is preferred.

In the present invention, it is essential to perform the treatment while depositing metal on the surface of the $SiO_2$ film and it is to be noted that even if the metal layer formed on the $SiO_2$ film is etched away after the evaporation treatment, the stability of the silicon oxide film is not harmed.

Figure 5:
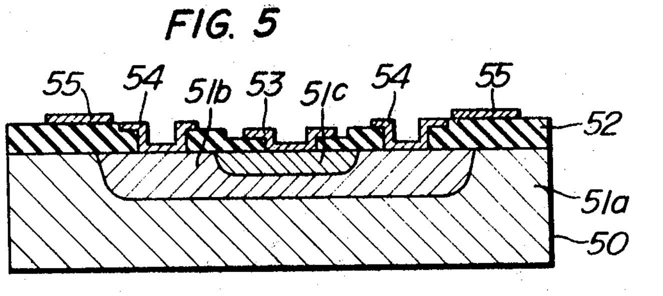
FIG. 5 is a sectional view of a planar transistor provided by a method of this invention.

Therefore, according to another embodiment of the invention, aluminum is evaporated all over the surface of the passivation film 52 (silicon oxide) having holes for forming electrodes of a planar type transistor 50 shown in FIG. 5 by the method according to the embodiment described hereinabove and the Al layer is etched away leaving an emitter electrode 53 and a base electrode 54. It is also permissible to leave a loop or annular Al layer 55 on the collector junction for the channel prevention as shown in the FIG. 5. By this method, a planar transistor having smaller variation of electrical characteristics with time and more stable is obtained.

According to a further embodiment of the invention, an MOS type element having a desired capacity-voltage characteristic is provided. Namely, by suitably controlling the voltage or the polarity of the power supply 7 in FIG. 1 a stable element having a point of rapid change of capacity at an arbitary point on the left of the curve 34 in FIG. 3 can be obtained. Further, the insulating film is not restricted to silicon oxide film, but silicon nitride film ($Si_3N_4$) or the like may be employed as well. This invention can be further applied to the manufacture of a semiconductor device comprising more special surface protecting layers; for example, silicon compound films including a vitrified surface layer consisting of phosphor oxide and silicon oxide.

Figure 6:
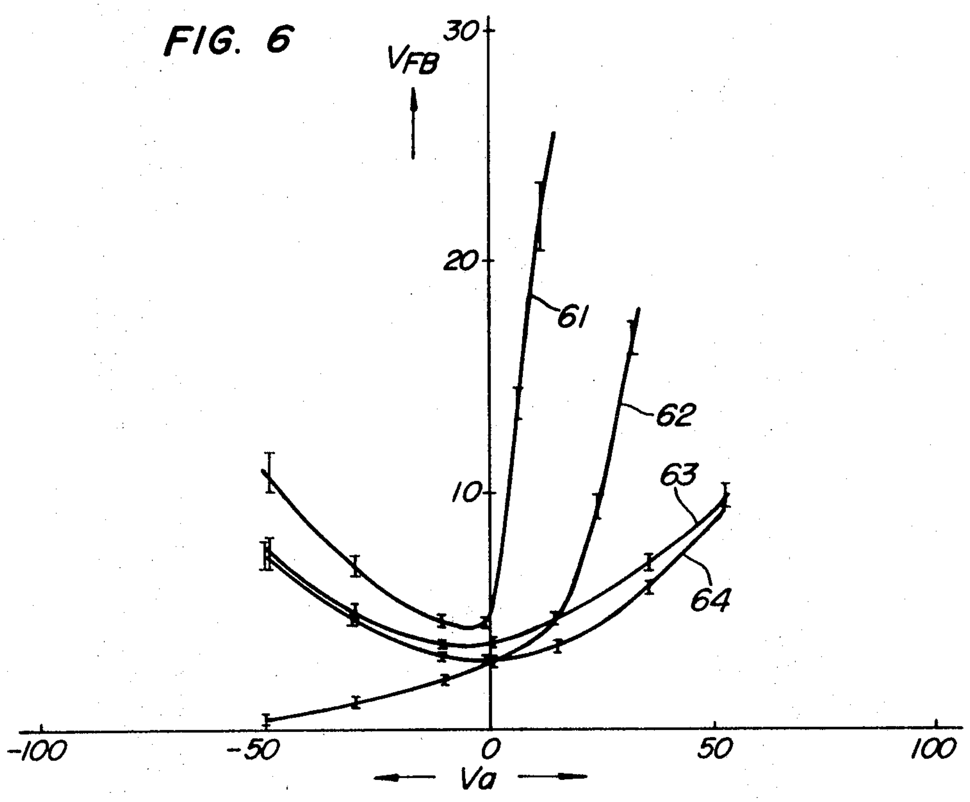
FIG. 6 is an electrical characteristic diagram for the explanation of yet another embodiment of the invention.

FIG. 6 shows the relation between the voltages $V_{FB}$ and $Va$ of an MOS type capacitor provided according to a further embodiment of this invention. The MOS type capacitor according to this embodiment is different from that explained in FIG. 4 in the points of the evaporating metal and the insulating film, but almost the same in view of the manufacturing method or the method of measurement. Curves 61, 63 and 64 show the relation between the voltages $V_{FB}$ and $Va$ of a plurality of test MOS type capacitors made of an wafer having an MOS structure by the sample making method, the wafer being provided by thermally forming in wet oxygen atmosphere an $SiO_2$ film of about 1800 A. in thickness on one principal surface of a P-type silicon substrate having a principal surface oriented in the (100) plane and a specific resistance of about 20Ω-cm. and evaporating some different kinds of metals on the film according to the method embodying the invention while heating the substrate to 500° C. and applying various predetermined voltages $Va$ between the evaporation source and the substrate. More specifically, curves 61, 63 and 64 show the cases where chromium, titanium and silver are evaporated, respectively. The characteristic diagrams also show the dispersion of $V_{FB}$ at various applied voltages. Though the data when the evaporation source and the substrate are made open are not shown in FIG. 6, the dispersion of $V_{FB}$ of about 5 v. appeared whatever metal was used.

It is understood from the above facts that the effect similar to that obtained with Al can be obtained with Cr, Ti or Ag. Curve 62 shows the relation between the voltages $V_{FB}$ and $Va$ and the dispersion of $V_{FB}$ of a MOS type capacitor provided by forming an $SiO_2$ film of 1800 A. in thickness on the surface of the silicon substrate described in conjunction with the present embodiment (specific resistance 20Ω-cm., orientation (100)); forming a vitrified surface layer comprising phosphor oxide and silicon oxide of about 800–1000 A. in thickness by subjecting the $SiO_2$ surface to a heat treatment for half an hour in the atmosphere of about 800° C. including a phosphor compound like $POCl_3$; and evaporating aluminum at the temperature of 500° C. with various applied voltages. It is understood from curve 62 that an MOS element, wherein the dispersion is small and $V_{FB}$ is nearly equal to OV when $Va=-50$ v., can be obtained. The fact that $V_{FB}$=OV means that the bending of the band hardly appears. Accordingly, it is an important and particular effect of this invention that the bending of the band of a silicon surface covered with a silicon oxide film can be prevented substantially by a simple method which does not require the introduction of an activating impurity.

Though some particular embodiments of the invention are described hereinabove, the invention is by no means restricted thereto. It will be evident for those skilled in the art that many modifications can be made without departing from the spirit of the invention and the scope of the appended claims.

What is claimed is:

1. A method of making a semiconductor device wherein a metallic conducting material vested with a substantially constant electric potential with respect to a semiconductor substrate is deposited from a vapor phase on an inorganic insulating protective film covering the surface of said semiconductor substrate to form a metal layer under the condition that the combination comprising said insulating protective film and said semiconductor substrate is heated to a temperature above 75° C. and below the value at which said combination is broken down.

2. A method according to claim 1 wherein a metal layer is selectively eliminated after a metal layer is formed on the surface of said film by depositing said metallic particles all over the surface of said film.

3. A method according to claim 1, wherein said semiconductor substrate is made of silicon and said insulating film is selected from the group of a silicon oxide film, a silicon nitride film and a vitrified film consisting essentially of silicon oxide and phosphorus oxide.

4. A method according to claim 1, wherein said semiconductor substrate is made of P-type silicon and said metallic material is vested with a negative potential with respect to said substrate.

5. A method according to claim 4, wherein said metallic conducting material is selected from the group of aluminum, chromium, titanium, and silver.

6. A method of making a semiconductor device comprising the steps of heating a combination consisting of a semiconductor substrate and an inorganic insulating protective film formed on the surface thereof to a temperature above 75° C. and below the value at which said combination is broken down; and depositing on said insulating protective film a metallic conducting layer from vapor phase through an electric field having a direction crossing said insulating protective film during said heating step.

7. A method according to claim 6, wherein said insulating protective film comprises one member selected from the group consisting of silicon oxide, silicon nitride and a vitrified mixture of silicon oxide and phosphorus oxide and said semiconductor substrate consists essentially of silicon.

8. A method according to claim 6, wherein said semiconductor substrate is made of P-type silicon, said insulating film is made of silicon oxide and said electric field is directed from the semiconductor substrate to the surface of the film.

9. A method according to claim 8, wherein said metallic conducting layer consists essentially of one selected from aluminum, chromium, titanium, and silver.

10. A method of making a semiconductor device comprising the steps of placing a support member whereupon a combination comprising a semiconductor substrate and an inorganic insulating protective film formed thereupon is mounted and a source of evaporating metal is provided in an evacuated enclosure in a way that said insulating film faces said source of evaporating metal; heating said combination to a temperature above 75° C. and below the value at which said combination is broken down; and depositing metal from said source of evaporating metal on said insulating film while applying a D.C. voltage between said source of evaporating metal and said support member during said heating.

11. A method according to claim 10, wherein said insulating film includes silicon oxide and said D.C. voltage is applied so that said source of evaporating metal becomes negative.

12. A method according to claim 10, wherein said semiconductor substrate is made of P-type silicon, said insulating film is made of silicon oxide and said voltage is applied in a way that said source of evaporating metal becomes negative with respect to said support member.

13. A method for fabricating a semiconductor device comprising the steps of vapor-depositing a metallic conducting material from a supply source thereof onto an inorganic insulating protective film covering a surface of a semiconductor body in an evacuated enclosure while applying a substantially constant electric potential with respect to said body to said supply source and heating said body to a temperature above 75° C. and below the temperature at which said body and said insulating protective film are broken down.

14. A method according to claim 13, wherein said supply source has an equipotential with respect to said body.

15. A method according to claim 13, wherein said body consists essentially of silicon and said insulating protective film is selected from the group consisting of a silicon oxide film, a silicon nitride film and a vitrified film of silicon oxide and phosphorus oxide.

16. A method according to claim 15, wherein said body has a P-conductivity type and said electric potential is applied to said supply source so that said supply source has a negative potential with respect to said body.

17. A method according to claim 15, wherein said body is heated to a temperature of about 200° C. to 600° C.

18. A method according to claim 15, wherein said metallic conducting material is selected from the group consisting of aluminum, chromium, titanium and silver.

19. A method of preparing an MOS type capacitor comprising heating a silicon semiconductor wafer having a principal surface in an atmosphere of wet air at a sufficient temperature to form a silicon dioxide film on the principal surface of the wafer, then depositing an electrode metal layer on said silicon oxide film by vapor depositing said metal layer while applying a substantially constant electric potential to the supply source of said metal layer with respect to said silicon dioxide coated semiconductor wafer and heating said silicon dioxide coated semiconductor wafer to a temperature of from about 75° C. to below the temperature at which the semiconductor wafer and the silicon dioxide coating are broken down.

20. A method according to claim 19, wherein the electrode metal layer is selectively removed from the silicon dioxide surface.

21. A method according to claim 19, wherein the electrode metal layer is aluminum, the electric potential applied is about 100 v. and the silicon dioxide semiconductor wafer is heated to a temperature of about 300° C.

22. A method according to claim 1, wherein the substrate is heated to a temperature between about 75° C. and about 600° C.

23. A method according to claim 1, wherein the substrate is heated to a temperature between about 200° C. and about 600° C.

24. A method according to claim 6, wherein the substrate is heated to a temperature between about 75° C. and about 600° C.

25. A method according to claim 6, wherein the substrate is heated to a temperature between about 200° C. and about 600° C.

References Cited

UNITED STATES PATENTS

| | | | |
|---|---|---|---|
| 2,759,861 | 8/1956 | Collins et al. | 117—107X |
| 2,993,266 | 7/1961 | Berry | 204—192UX |
| 2,995,475 | 8/1961 | Sharpless | 117—217X |
| 3,081,201 | 3/1963 | Koller | 117—217X |
| 3,290,753 | 12/1966 | Chang | 156—17X |
| 3,325,258 | 6/1967 | Fottler et al. | 117—107X |
| 3,445,924 | 5/1969 | Cheroff et al. | 317—235(21.1) |

RALPH S. KENDALL, Primary Examiner

U.S. Cl. X.R.

117—107